(12) United States Patent
Casset et al.

(10) Patent No.: US 8,766,381 B2
(45) Date of Patent: Jul. 1, 2014

(54) INTEGRATED CIRCUIT COMPRISING A DEVICE WITH A VERTICAL MOBILE ELEMENT INTEGRATED IN A SUPPORT SUBSTRATE AND METHOD FOR PRODUCING THE DEVICE WITH A MOBILE ELEMENT

(75) Inventors: Fabrice Casset, Tencin (FR); Lionel Cadix, Grenoble (FR); Perceval Coudrain, Grenoble (FR); Alexis Farcy, La Ravoire (FR); Laurent-Luc Chapelon, Domene (FR); Yacine Felk, Grenoble (FR); Pascal Ancey, Revel (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 164 days.

(21) Appl. No.: 13/230,035

(22) Filed: Sep. 12, 2011

(65) Prior Publication Data
US 2012/0074527 A1 Mar. 29, 2012

(30) Foreign Application Priority Data
Sep. 10, 2010 (FR) ...................................... 10 03633

(51) Int. Cl.
*H01L 29/06* (2006.01)

(52) U.S. Cl.
USPC ........... 257/416; 257/414; 257/514; 257/417; 257/E29.324

(58) Field of Classification Search
USPC .......................................................... 333/231
See application file for complete search history.

(56) References Cited

U.S. PATENT DOCUMENTS

| | | | | |
|---|---|---|---|---|
| 6,087,701 A | * | 7/2000 | Bergstrom et al. | 257/414 |
| 6,356,172 B1 | * | 3/2002 | Koivisto et al. | 333/231 |
| 2006/0141786 A1 | | 6/2006 | Boezen et al. | |
| 2008/0264168 A1 | * | 10/2008 | Stewart | 73/504.13 |
| 2009/0152654 A1 | | 6/2009 | Classen et al. | |

FOREIGN PATENT DOCUMENTS

EP    1 785 392 A2    5/2007

* cited by examiner

*Primary Examiner* — Victor A Mandala
*Assistant Examiner* — William Harriston
(74) *Attorney, Agent, or Firm* — Oliff PLC

(57) ABSTRACT

The integrated circuit comprises a support substrate having opposite first and second main surfaces. A cavity passes through the support substrate and connects the first and second main surfaces. The integrated circuit comprises a device with a mobile element, the mobile element and a pair of associated electrodes of which are included in a cavity. An anchoring node of the mobile element is located at the level of the first main surface. The integrated circuit comprises a first elementary chip arranged at the level of the first main surface and electrically connected to the device with a mobile element.

5 Claims, 5 Drawing Sheets

INTEGRATED CIRCUIT COMPRISING A DEVICE WITH A VERTICAL MOBILE ELEMENT INTEGRATED IN A SUPPORT SUBSTRATE AND METHOD FOR PRODUCING THE DEVICE WITH A MOBILE ELEMENT

BACKGROUND OF THE INVENTION

The invention relates to an integrated circuit comprising a support substrate having opposite first and second main surfaces and a device with a mobile element integrated in said support substrate.

The invention also relates to a method for producing such a device with a mobile element comprising a mobile element and an electrode.

STATE OF THE ART

To continue the race towards miniaturization and mastery of costs, discrete elements are eliminated and the functions are integrated in elementary electronic chips. To obtain the required functionalities, a large number of elementary chips are associated to achieve a final chip which presents the required functions. Each elementary chip is produced using a technology which is proper thereto in order to master production costs, space occupation and/or consumed power.

In this race for miniaturization, integration which used to be two-dimensional has become three-dimensional. The elementary chips are integrated on each side of a support substrate so as to take advantage of extra surface and to preserve a final chip having a substantially constant volume.

Replacement of the discrete electronic or mechanical devices (sensors) by new components formed within the chips has enabled a gain in space, but this has also resulted in an increase of the size of the elementary chips and especially in the need to implement complex production methods.

OBJECT OF THE INVENTION

It is observed that a requirement exists to provide an integrated circuit which incorporates a mobile element associated with an elementary electronic chip while at the same time remaining of small size.

For this, it is in particular sought to produce an integrated circuit characterized in that:
a cavity passes through the support substrate and connects the first and second main surfaces,
the mobile element is included in the cavity, the mobile element having an anchoring node at the level of the first main surface and a maximum displacement area, the anchoring node and maximum displacement area being connected by an axis perpendicular to the first and second main surfaces,
a first elementary chip is arranged at the level of one of the main surfaces and is electrically connected to the device with a mobile element.

It is also observed that a requirement exists to provide a production method of such a device with a mobile element that is easy to implement.

The device is produced by means of a method comprising the following steps:
forming an etching mask simultaneously delineating the patterns of the electrode and of the mobile element on a main surface of a support substrate,
forming a hole representative of the electrode and a hole representative of the mobile element in the support substrate, from the etching mask,
forming the future mobile element and electrode in the support substrate,
releasing the mobile element.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
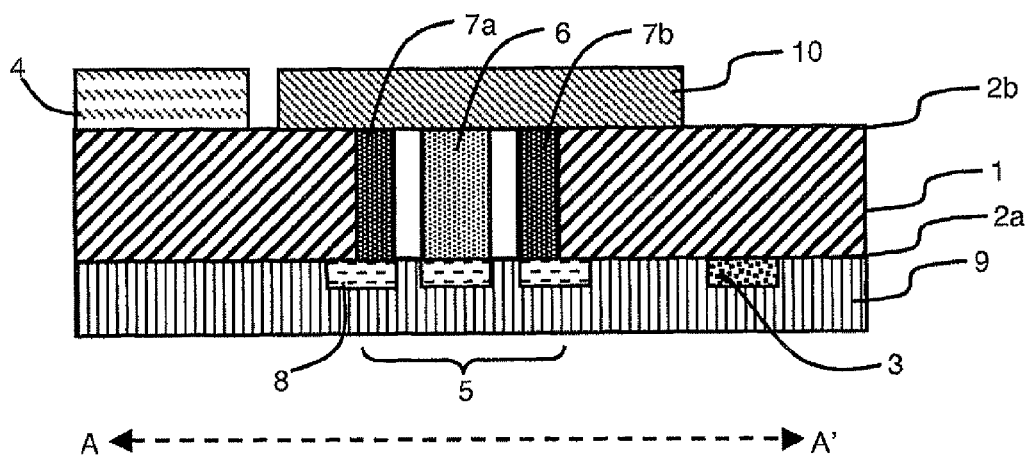
FIG. 1 schematically represents an integrated circuit comprising an elementary chip and a device with a mobile element, in cross-section, FIG. 2 schematically represents the pattern of a device with a mobile element in an etching mask, in top view, FIGS. 3 to 5 schematically represent steps of a method for producing a chip, in cross-section, FIGS. 6 to 8 schematically represent steps of a second method for producing an integrated circuit, in cross-section, FIGS. 9 to 12 schematically represent steps of a third method for producing an integrated circuit, in cross-section, FIG. 13 schematically represent an alternative embodiment of an integrated circuit with a pass-through connection of its support substrate, in cross-section.

As illustrated in FIG. 1, in cross-section along the direction A-A', an integrated circuit comprises a support substrate 1 having opposite first 2a and second 2b main surfaces. The circuit comprises a first elementary electronic chip 3 which is integrated in support substrate 1 at the level of its first main surface 2a. The circuit advantageously comprises a second elementary electronic chip 4 which is located at the level of the second main surface 2b of the support substrate 1. First 3 and second 4 elementary electronic chips are separated by support substrate 1.

Elementary chips 3, 4 are mounted on support substrate 1 which performs mechanical securing of the assembly. Support substrate 1 is for example an interface plate on which several elementary chips are arranged to form a more complex component with predefined functionalities. Support substrate 1 is made from any material, for example from polymer, silicon, etc. Depending on the embodiments, the material of support substrate 1 is electrically insulating or conducting or even semi-conducting. In a particular embodiment, support substrate 1 is a silicon or glass substrate. The support substrate can be an electronic chip which comprises transistors and or electromechanical microsystems on one of the surfaces of its transistors. The rigidity of the support substrate depends on the required applications.

A device with a mobile element 5 is formed in support substrate 1. Mobile element 6 of the device 5 is formed between first 2a and second 2b main surfaces. Device with a mobile element 5 can be aligned with first 3 and second 4 elementary chips in the depthwise direction of the substrate.

Device with a mobile element 5 comprises a mobile element 6 and at least one electrode 7, here a pair of electrodes 7 (FIG. 1), for example an excitation electrode 7a and a detection electrode 7b. Excitation electrode 7a makes mobile element 6 oscillate around an equilibrium position. Detection electrode 7b provides a signal representative of the movement of mobile element 6.

Device with a mobile element 5 can also comprise actuating means of mobile element 6. These actuating means can be of electrostatic type like excitation electrode 7b, but it is also possible to integrate actuating means of magnetic, thermal or other type.

Device with a mobile element 5 is for example an electromechanical resonator, a variable capacitance or a switch.

Device with a mobile element 5 is electrically connected to electronic chip 3. According to the embodiments, chip 3 receives the signal representative of movement of the mobile element or it provides an excitation signal to mobile element 6. It can also be envisaged for chip 3 to perform biasing of the different elements of device with a mobile element 5.

Electronic chip 4 can be electrically connected to chip 3 and/or to device with a mobile element 5. Electrical connection of chip 4 with the other elements makes for more robust operation and/or provides new functionalities while at the same time preserving a compact assembly.

Electric connection can be obtained by different means, for example by electric tracks 8 present on support substrate 1 or by electric tracks 8 present on additional substrates 9 comprising first 3 and/or second 4 chips. Electric connection can also be obtained by forming oscillating device 5 directly in contact with one of the chips by means of contact bumps present on the chip.

Integration of mobile element 6 and of its electrode or electrodes 7 in support substrate 1 makes for space saving and provides greater freedom in producing the chips. It is no longer necessary to integrate a discrete device with a mobile element at the surface of support substrate 1, nor does device with a mobile element 5 have to be integrated in a chip above the transistors.

This architecture enables mobile elements of large dimensions to be formed as they are made in the substrate. This enables formation of a mobile element acting as time base while at the same time presenting very good performances and small space occupation. This further enables variable capacitances to be formed in large ranges of values as they depend on the surfaces of the mobile element. It is further possible to form a switch operating with voltages that are fairly uncommon as the value of the control voltage is linked to the dimensions of the mobile element. This architecture enables formation of mobile elements in very large ranges of sizes, for example having a thickness and/or width presenting nanometric to micrometric dimensions.

Mobile element 6 and its associated electrode or electrodes 7 are disposed in a closed cavity, preferably a sealed cavity. The cavity presents side walls formed by support substrate 1. If the cavity is of cylindrical cross-section, the cavity only presents a single side wall assimilated to several side walls. The side walls originate from a hole formed in support substrate 1 which passes through support substrate 1, here a hole formed from main surface 2b to main surface 2a. The cavity joins first 2a and second 2b main surfaces.

The cavity is closed by sealing plugs 10. First and second sealing plugs are present on first 2a and second 2b main surfaces of support substrate 1. In certain embodiments, the sealing plugs are formed by additional substrates 9 comprising an electronic chip (FIG. 1).

The cavity is delineated by opposite first and second main walls which are situated at the level of first 2a and second 2b main surfaces of support substrate 1 and which close the cavity. The first and second main walls are therefore separated by support substrate 1. The first and second main walls are separated by mobile element 6 and electrodes 7.

An anchoring node, also called embedding node, of mobile element 6 is arranged at the level of one of the main surfaces of support substrate 1 by means of one of sealing plugs 10. In other words, one of the main walls of the cavity comprises an anchoring node of mobile element 6.

Electric tracks 8 pass through the sealing plugs to enable operation of oscillating device 5. This enables the different biases to be defined, the excitation signal to be provided and/or a detection signal to be recovered. The cavity is limited to the volume necessary for mobile element 6 and its associated electrode or electrodes 7. The other components of the device with a mobile element, such as a feedback loop for example, are located outside the cavity.

In a preferred embodiment, the gain in compactness in the device also results from the use of a device with a mobile element 5 formed with a vertical architecture instead of a horizontal architecture. In this vertical architecture, mobile element 6 presents an anchoring node at the level of one of its main surfaces and is oriented perpendicularly to the first main surface of support substrate 1 in the direction of the second main surface. Mobile element 6 is thus formed inside the support substrate. Mobile element 6 presents at least one nil displacement area represented by the anchoring node and a maximum displacement area, i.e. the area of the mobile element adapted to be farthest away from its position at equilibrium. Depending on the embodiments and the movement imposed on mobile element 6, this maximum displacement area can be located at any place of the mobile element.

In the vertical architecture, the maximum displacement area of the mobile element moves in a plane perpendicular, or substantially perpendicular, to the axis connecting this area to the anchoring node. In this embodiment, the maximum displacement area is comprised in a plane parallel to the first main surface or parallel to the two main surfaces. For example purposes, in an architecture with single embedment, the maximum displacement area can be situated at the opposite end from the embedment area. In an architecture of embedded-embedded type, the maximum displacement area can be situated between the two embedment nodes, preferably at equal distance from the nodes.

The facing surfaces of mobile element 6 and of associated electrodes 7 are perpendicular to the first main surface. These facing surfaces represent most of the surface of mobile element 6. The facing surfaces of mobile element 6 and of associated electrode or electrodes 7 are comprised between main walls 2a and 2b of support substrate 1. This vertical orientation of mobile element 6 and of electrodes 7 enables advantage to be taken of a mobile element of large size while at the same time limiting the occupied surface on the main surfaces of support substrate 2.

The device with a mobile element having a vertical architecture, most of the inner surface of the cavity is formed by its side walls. Pollution of the internal atmosphere from the outside is limited due to the small surfaces represented by sealing plugs 10. As the side walls are machined in support substrate 1, this enables the risks of desorption to be limited thereby ensuring a better-quality atmosphere in the cavity. This is particularly efficient when the support substrate is made from silicon and more particularly from single-crystal silicon.

Formation of the cavity in the support material further results in a certain mechanical strength, i.e. enhanced protection against shocks and therefore dependable operation of device with a mobile element 5.

In preferred manner, mobile element 6 presents an axis of symmetry and/or a plane of symmetry which is perpendicular to the first main surface. In an even more preferred manner, device with a mobile element 5 presents an axis of symmetry and/or a plane of symmetry perpendicular to the first main surface. This enables better control of operation of the device with a mobile element.

When mobile element 6 is of single-embedment (cantilever) type, the anchoring node is formed at the level of the first main surface or at the level of the second main surface. The axis joining the anchoring node to the free end of the beam is perpendicular to the main surface containing the anchoring. If mobile element 6 is of double-embedment type, a first anchoring point is formed the level of the first main surface and a second anchoring point is formed on the second main surface. The axis joining the two anchoring points is perpendicular to the main surfaces. In so far as deformations are small, the axis joining the maximum displacement area to the embedment node is considered as remaining perpendicular to the main surface containing the anchoring node.

In a first embodiment, the length of mobile element 6 is equal to the thickness of support substrate 1. In an alternative embodiment, the length of mobile element 6 is smaller than the thickness of support substrate 1. This modification of the length for example enables the resonance frequency of the device to be changed. Shortening of the mobile element 6 can be performed by any suitable technique, for example by plasma etching.

In a preferred embodiment, the length of electrodes 7 is equal to the thickness of support substrate. It can also be envisaged to reduce the length of electrodes 7.

In another advantageous embodiment, the length of mobile element 6 and of electrodes 7 are identical, which makes for better detection or excitation of the mobile element. This advantage stems from definition of the electrodes by means of holes in support substrate 1.

In a particular embodiment, a part of the cavity is delineated by electrodes 7 which are in direct contact with support substrate 1. In this way, electrodes 7 are stuck to support substrate 1. This embodiment is particularly advantageous in a vertical architecture where the electrodes present a very great length. This particular embodiment enables the risks of deformation of the electrodes to be reduced thereby enhancing the performances of the device with time.

Figure 2:
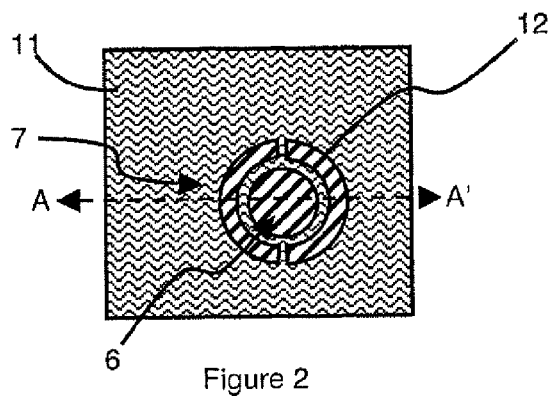
Figure 3:
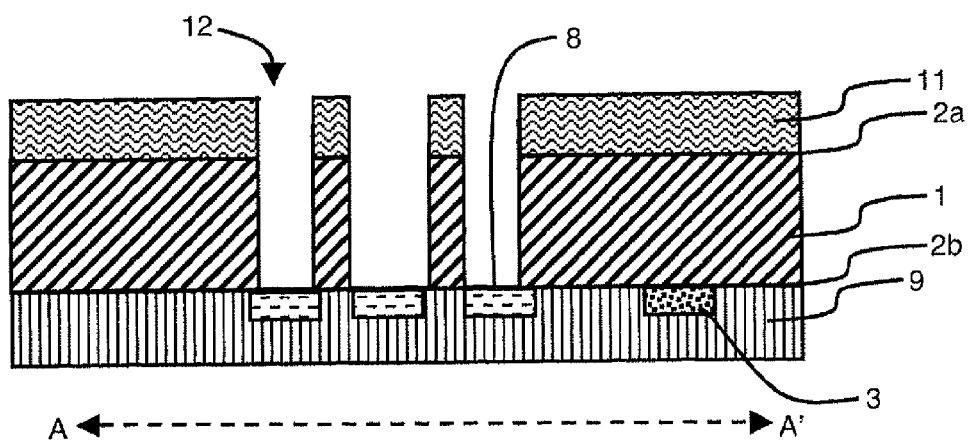

In general manner, the method comprises formation of etching mask 11 of main surfaces 2 of support substrate 1, as illustrated in FIGS. 2 and 3. Etching mask 11 comprises the pattern of at least one of electrodes 7 and of its mobile element 6. Etching mask 11 can be a photoresist layer originating from a photolithography step or an intermediate etching mask, also called hard mask, for example made from insulating dielectric material. The pattern of the intermediate etching mask is derived from the pattern of the initial etching mask.

FIG. 2 illustrates the pattern of etching mask 11 and the holes resulting therefrom inside the support substrate, in top view. FIG. 2 also indicates line A-A' representative of the other figures.

As illustrated in FIG. 3 in cross-section along line A-A', holes 12 representative of electrodes 7a, 7b and of mobile element 6 are formed in support substrate 1. In preferential manner, the holes representative of mobile element 6 and of electrodes 7 are formed at the same time, but it can also be envisaged to form them one after the other. Holes 12 are formed by means of etching mask 11 by any suitable technique, for example by plasma etching. As indicated in the foregoing, it is possible to form a single electrode 7 only.

Figure 4:
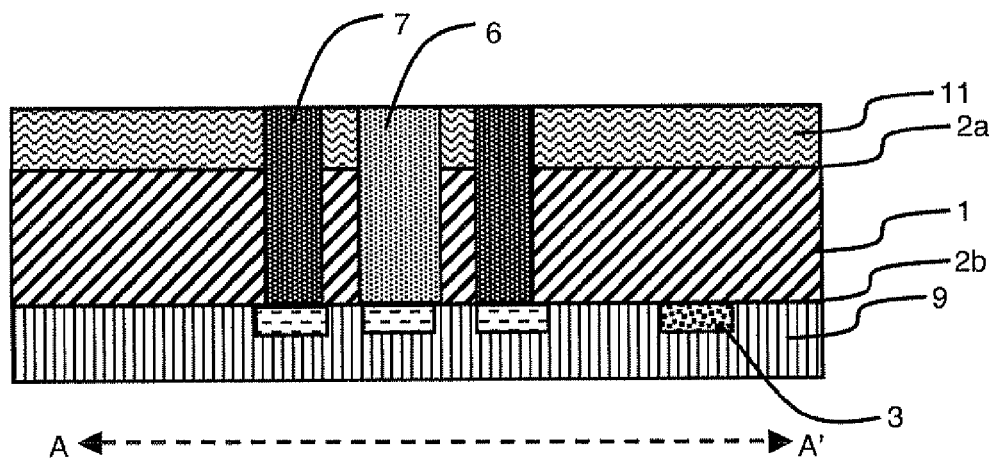

As illustrated in FIG. 4, holes 12 are then filled by an electrically conducting material so as to form the mobile element 6 and electrode 7 in support substrate 1.

Figure 5:
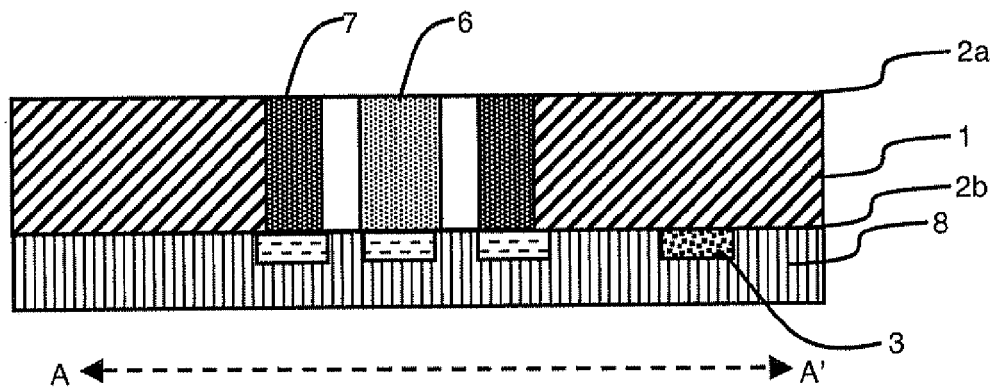

As illustrated in FIG. 5, a part of support substrate 1 is then eliminated to release mobile element 6. One of the ends of mobile element 6 is embedded before the releasing step. Etching mask 11 has also been eliminated to reach support substrate 1.

Depending on the production methods used, it is possible to eliminate etching mask 11 after the holes have been formed or when the electrically conducting material is localized in holes 12. It is also possible to keep it in the final device.

A sealing plug 10 is then placed on the free surface of the support substrate to close the cavity as illustrated in FIG. 1.

In preferred manner, etching mask 11 comprises the pattern of mobile element 6 and of the pair of electrodes 7 with which it is associated. In an alternative embodiment, etching mask 11 comprises the patterns of other components of device with a mobile element 5 or of other elements passing through support substrate 1 (such as interconnections). The pattern of mobile element 6 and electrodes 7 is represented by blank areas of etching mask 11.

The operating characteristics of device with mobile element 5 are partly linked to the materials used and to the dimensions of the holes. In a particular embodiment illustrated in FIGS. 1, 4 and 5, a first conducting material is used to form mobile element 6 and a second conducting material is used to form electrodes 7. This differentiation enables good electrical performances to be obtained for electrodes 7 and the required mechanical performances for element 6 to also be obtained. However, the use of the same electrically conducting material facilitates the production method.

In a first particular embodiment illustrated in FIG. 3, chip 3 is formed at the level of a substrate 9. In preferred manner, chip 3 is formed in a semi-conductor substrate. Chip 3 comprises one or more electric tracks 8 running on substrate 9 and serve the purpose of supplying device with a mobile element 5 to come. Chip 3 and electric tracks 8 can be uncovered or covered by a passivation film. Electric tracks 8 are formed by an electrically conducting material such as a metal or a doped semi-conductor material. It can also be envisaged to form chip 3 on another substrate and to then integrate it in additional substrate 9.

Substrate 9 is stuck to support substrate 1 covering and protecting chip 3 and electric tracks 8.

In a particular embodiment, substrate 9 is thinned after it has been stuck to support substrate 1.

A plurality of holes 12 are formed in support substrate 1 from the second main surface. Holes 12 will define the shape of a future mobile element 6, and of its associated electrode or electrodes, for example excitation 7a and detection 7b electrodes in support substrate 1.

Holes 12 pass through support substrate 1 in order to uncover electric track or tracks 8 of substrate 9. Holes 12 are defined from a photolithography step followed by an etching step. For example purposes, for an electromechanical resonator, the length is equal to 50 µm and the width is comprised between 1 µm and a few tens of micrometers.

Holes 12 therefore pass right through support substrate 1 but stop in substrate 9 or at the surface of substrate 9. The shape of holes 12 defines the shape of mobile element 6 and of its associated electrodes 7. The depth of the holes, i.e. the thickness of the substrate, defines the length of electrodes 7 and of mobile element 6. The distance between the holes defines a separating distance (air-gap) between mobile element 6 and its excitation electrode 7a or between mobile element 6 and its detection electrode 7b. Mobile element 6 and electrodes 7 being defined at the same time in the same photolithographic step, this enables self-alignment of mobile element 6 to be obtained with respect to its associated electrodes 7.

Figure 6:
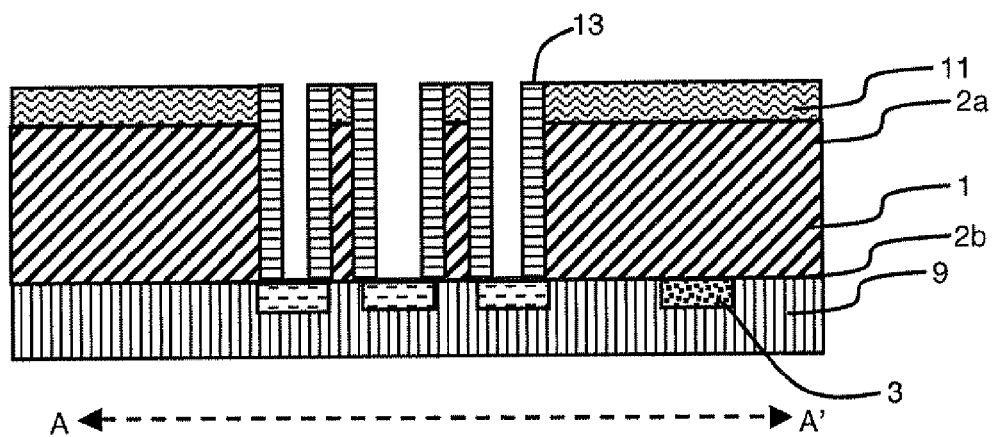

In a particular embodiment illustrated in FIG. 6, in cross-section along line A-A' of FIG. 3, support substrate 1 is electrically conductive. To prevent any short-circuiting between the different elements of the device with a mobile element 5, a layer 13 of electrically insulating material is deposited on the side walls of holes 12. The thickness of electrically insulating layer 13 enables the width and thickness of mobile element 6 and of its electrodes 7 to be defined and/or corrected from that defined by photolithography.

It is also conceivable to differentiate the thickness and nature of the insulating material formed in the different holes 12. This differentiation enables the dimensions of the different electrodes 7 and of mobile element 6 to be modulated. It also enables the air gap to be modulated.

This flexibility of fabrication is not possible when electrodes 7 and mobile element 6 are formed directly by etching of the conductive material.

Electrically insulating layer 13 can be produced by any suitable technique, for example by oxidation of the materials present or by deposition of an electrically insulating material. In preferred manner, electrically insulating layer 13 is deposited at low temperature, for example by plasma enhanced chemical vapor deposition, in order to limit the thermal budget imposed on chip 3. For example purposes, the insulating layer is a silicon oxide with a thickness comprised between 50 and 200 nm. The material of electrically insulating layer 13 is advantageously chosen to limit losses and stray capacitances within the device.

Even if substrate 1 is not electrically conductive, it is advantageous to use a layer 13 made from a material which can be sacrificial in order to control the dimensional characteristics of the device.

Figure 7:
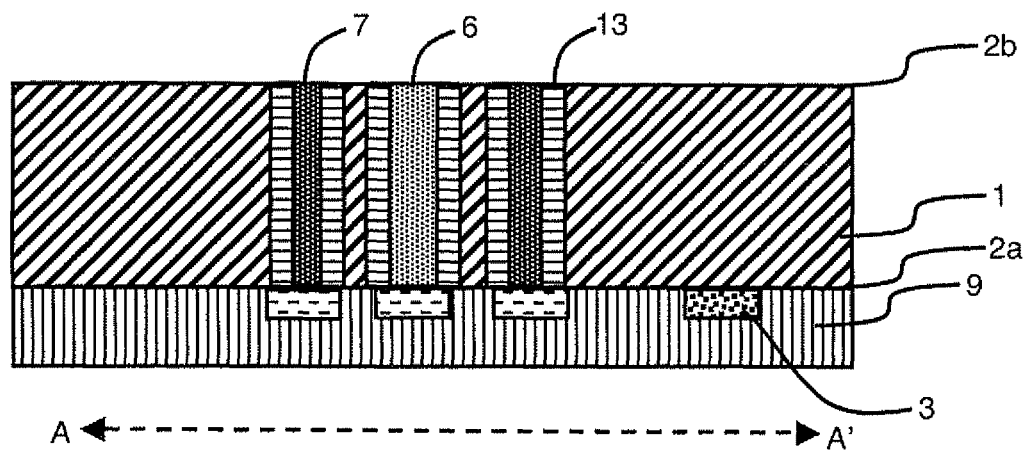

As illustrated in FIG. 7, holes 12 are then filled by an electrically conductive material such as a metal or a doped semi-conductor material. At this time, electrodes 7 are formed, as is mobile element 6. Localization of the electrically conductive material is performed by any suitable means, for example by means of a chemical mechanical polishing step and/or of a plasma etching step.

In a preferred embodiment, if the conductive material deposited in holes 12 is a metal and if electric tracks 8 are made from doped semi-conductor material, it is advantageous to perform a silicidation step of electric tracks 8 before depositing the metal. This silicidation enables better electric properties to be obtained.

This silicidation is also advantageous as far as mobile element 6 is concerned as it enables better mechanical properties to be obtained.

Figure 8:
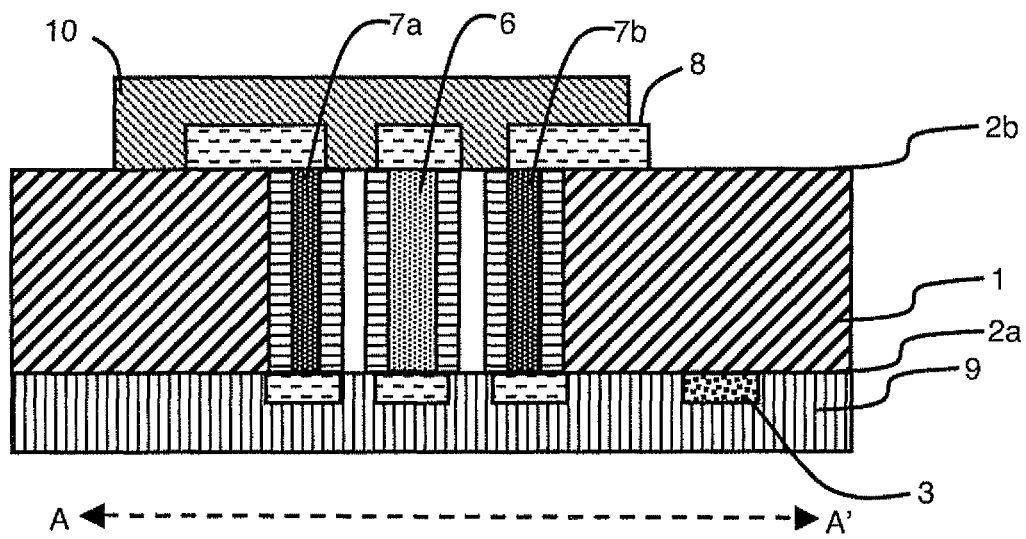

Depending on the embodiments used, once mobile element 6 and its associated electrodes 7 have been formed, it is possible to form a second embedment point of mobile element 6 on the second main surface of support substrate 1. Element 6 is then of embedded-embedded type. This additional embedment can be formed for example by a second electric track 8 as illustrated in FIG. 8

It is also possible to form new electric tracks 8 connected only to detection and/or excitation electrodes 7, on the second main surface.

Mobile element 6 is then released by eliminating the material of support substrate 1 which is located between mobile element 6 and excitation electrode 7a and the material located between mobile element 6 and detection electrode 7b. A sealing plug 10 is then deposited to close the cavity as illustrated in FIG. 8.

Electronic chip 4 can subsequently be mounted on support substrate 1 to operate in conjunction with chip 3 and/or oscillating element 5 or to perform another function.

In an alternative embodiment that is not represented, substrate 9 does not comprise any electric tracks 8 and power supply of the device with a mobile element 5 is performed from the second main surface of support substrate 1. Substrate 9 comprises chip 4 and chip 3 is subsequently mounted on the other surface of support substrate 1.

In yet another alternative embodiment that is not represented, electric tracks 8, connected to the device with a mobile element 5, are present partially on the first main surface and partially on the second main surface of support substrate 1.

In a second embodiment, chip 3 is formed on main surface 2a of substrate 9 which acts as support substrate 1.

Figure 9:
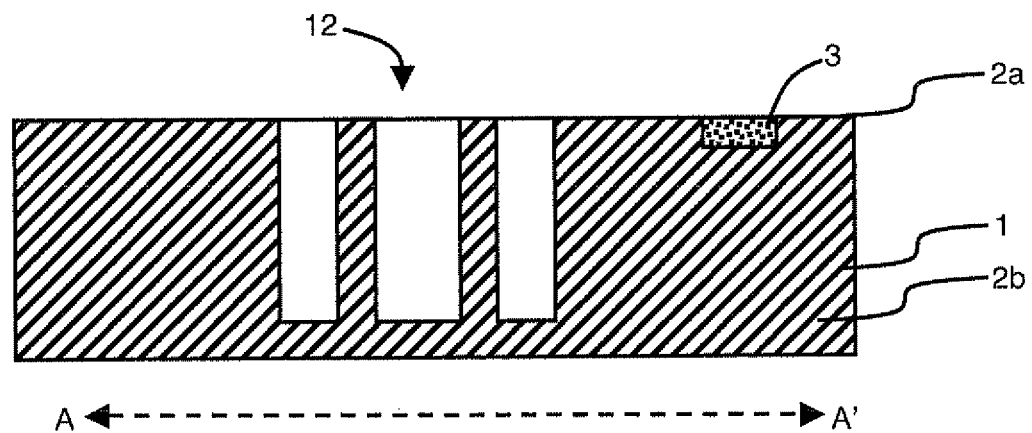

As illustrated in FIG. 9 in cross-section along line A-A' of FIG. 2, a plurality of holes 12 are formed in support substrate 1 from main surface 2a. As in the foregoing, holes 12 define mobile element 6 and its associated electrodes 7. As in the foregoing, holes 12 are formed from etching mask 11 which was eliminated in FIG. 9.

Depending on the embodiments used, the holes can pass through or stop in support substrate 1. If the holes pass right through support substrate 1 (embodiment not represented), it is advantageous to form a covering pattern on one of the main surfaces sealing off the bottom of holes 12.

Figure 10:
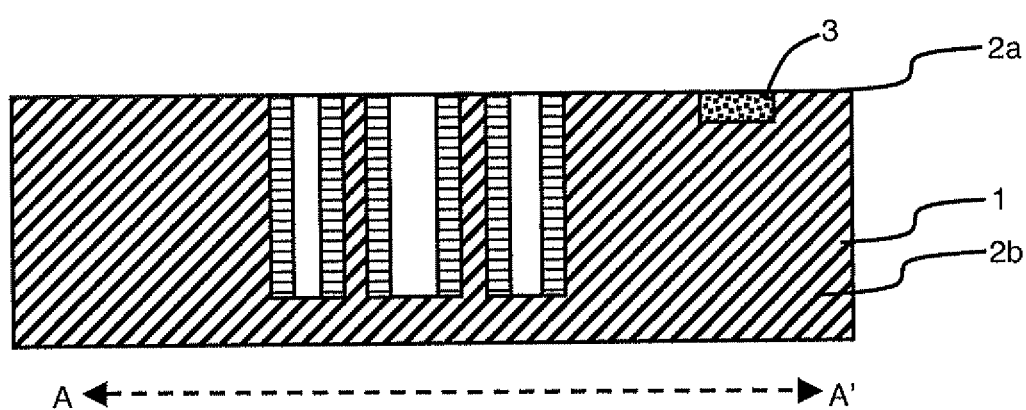

As in the previous embodiment, if support substrate 1 is electrically conductive, an electrically insulating layer 13 is formed on the side walls to ensure electric independence of the different components, as represented in FIG. 10. In advantageous manner, electrically insulating layer 13 is also used even if the support substrate is electrically insulating to limit losses and stray capacitances.

As in the previous embodiment, holes 12 are filled by an electrically conductive material to form electrode or electrodes 7 and future mobile element 6.

Figure 11:
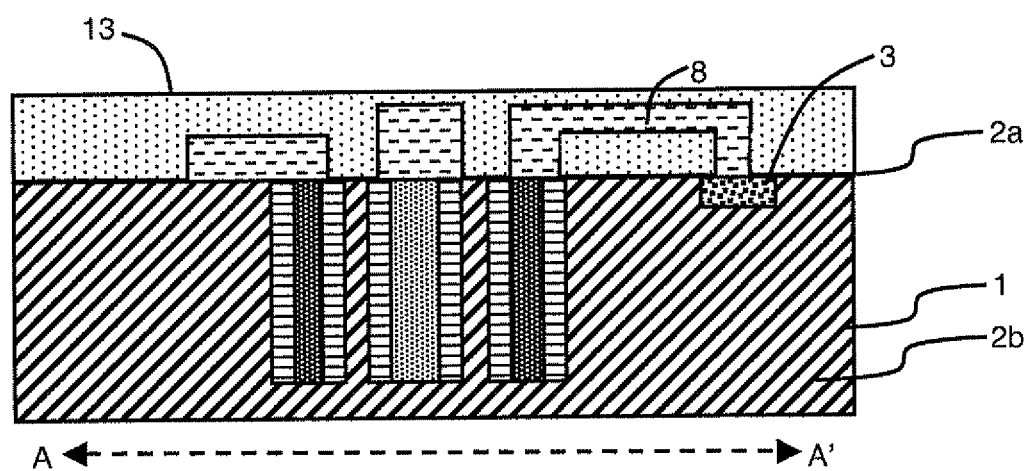

As illustrated in FIG. 11, electric tracks 8 supplying power to device with a mobile element 5 are formed on a main surface of support substrate 1, here first surface 2a. Electric tracks 8 are formed by any suitable technique 8, for example by means of deposition and etching of an electrically conductive material. It is however also possible to form the electric tracks in the metal interconnect levels of first chip 3 (FIG. 11).

In a particular embodiment, a first embedment point is formed on the first main surface.

In advantageous manner, the first main surface of support substrate 1 is then covered by a passivation layer 13 which forms a sealing plug.

Figure 12:
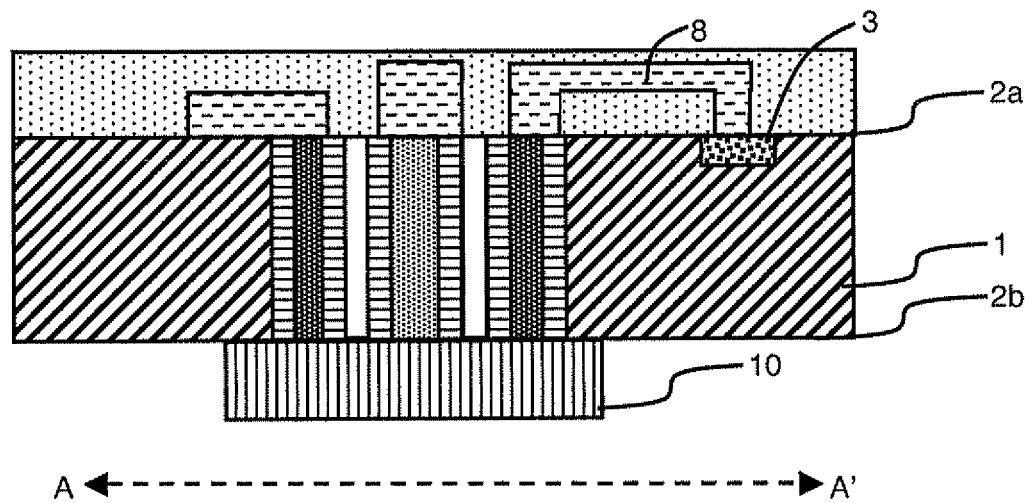

As illustrated in FIG. 12, holes 12 which were filled by the electrically conductive material are then uncovered at the level of their bottom. If a covering pattern was used, the latter is eliminated. If holes 12 do not pass through support substrate 1, i.e. blind holes 12 are involved, the second main surface is etched in order to uncover the future mobile element 6 and its associated electrodes 7.

Etching of the second main surface of support substrate 1 or removal of covering pattern 10 can be performed by any means, for example by plasma etching or by wet process or by means of a chemical mechanical polishing step.

Once electrodes 7 and mobile element 6 have been partially uncovered, the material of support substrate 1 is eliminated between mobile element 6 and its associated electrodes 7, which has the effect of releasing mobile element 6.

The second main surface is then covered by a sealing plug which can be a new covering pattern. Depending on the embodiments used, sealing plug 10 either forms a second embedment point on the second main surface or not.

As in the previous embodiment, it is possible to differentiate the material forming mobile element 6 from that forming electrodes 7.

This second embodiment is particularly advantageous as it enables device with a mobile element 5 to be produced in the semi-conductor substrate on which the first chip is formed. Device with a mobile element 5 is thus formed as close as possible to the active elements of the first chip, which enables stray capacitances and resistances to be reduced.

Definition of the shape of mobile element 6 and of its electrodes 7 in a single photolithography step enables self-alignment of these elements to be achieved. This self-alignment notably reduces the alignment constraints imposed in the different photolithography steps used. It also ensures that the air-gap between mobile element 6 and its associated electrodes 7 is constant and/or controlled.

As it is possible to perform separate treatment of the different holes as far as the nature of the deposited materials and the required thicknesses are concerned, this production method provides an additional differentiation lever between several devices with a mobile element formed in support substrate 1. It is then possible to obtain devices with a mobile element presenting different air-gap and/or stiffness characteristics without changing the photolithographic mask or the exposure and development conditions.

As mobile element 6 is integrated in the volume of support substrate 1 with a vertical architecture, device with a mobile element 5 occupies a very small amount of space in the final device. In a particular embodiment, this enables at least one chip to be integrated on each main surface and device with a mobile element 5 to be integrated between the two chips. This particular organization also enables electric connections 14 to be made through support substrate 1 without being hampered by device with a mobile element 5.

Figure 13:
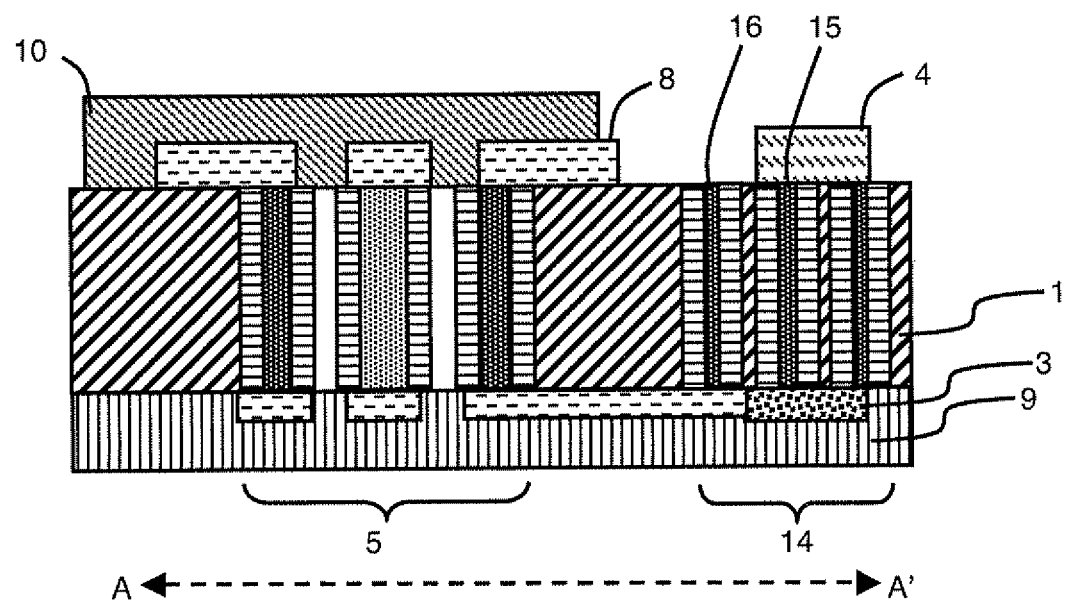

The circuit then comprises a chip 3 located on a first main surface of a support substrate 1 and a chip 4 located on a second main surface of a support substrate 1. It also comprises a device with a mobile element 5 located in support substrate 1. It further comprises an electric connection 14 connecting the first main surface to the second main surface passing through support substrate 1. This electric connection 14 can electrically connect chip 3 to chip 4 (FIG. 13 in cross-section) or perform electric connection between a power supply source and a chip located on an opposite surface.

In advantageous manner, electric connection 14 passing through support substrate 1 is formed at the same time as device with a mobile element 5. In even more advantageous manner, the pass-through electric connection is said to be coaxial. This particular connection comprises an electrically conducting body 15 separated from an electrically conducting sheath 16 by an electrically insulating material. The body and sheath are coaxial. In the present case, a ring in the support substrate, which is also coaxial, separates sheath 16 from body 15. This ring is itself separated from body 15 and from sheath 16 by a layer of electrically insulating material in the form of a ring.

To facilitate fabrication of this structure, the etching mask comprises the pattern of device with a mobile element 5 and that of pass-through electric connection 14. The pattern represents a disc or a disc surrounded by a ring which is preferably coaxial. The production method is identical to the one described in the foregoing, but it is not necessary to eliminate the material of substrate 1 inside sheath 16. In an alternative embodiment, the material of substrate 1 is eliminated to form a connection with an air cavity.

Connection with a chip can be obtained by opening out directly onto a chip or by means of electric tracks 8.

The electrically conductive material forming body 15, sheath 16, electrodes 7 and mobile element 6 is for example chosen from copper, gold or doped polysilicon. The distance between sheath 16 and body 15 is advantageously comprised between 50 and 100 nm for the lowest values. However, higher values are possible depending on requirements.

The thickness of element 6 and the diameter of body 15 are advantageously comprised between 1 and 5 μm. The thickness of support substrate 1 is advantageously comprised between 15 and 50 μm which corresponds to a particularly interesting length of mobile element 6.

Device with a mobile element 5 enables an electromechanical resonator to be formed if it is associated with a feedback loop. For example purposes, it is also possible to form a variable capacitance by moving mobile element 6 with respect to electrodes 7. It is further possible to form a switch by allowing electric contact between mobile element 6 and one of electrodes 7, mobile element 6 being moved by means of the control electrode.

The invention claimed is:

1. An integrated circuit comprising:
   a support substrate provided with opposite first and second main surfaces,
   a cavity passing through the support substrate from one of the main surface to the opposite main surface,
   a device with a mobile element formed in said support substrate, wherein the mobile element is included in the cavity, the mobile element having a first anchoring node on the first main surface, a second anchoring node on the second main surface, and a maximum displacement area, the first and second anchoring nodes and the maximum displacement area defining an axis substantially perpendicular to the first and second main surfaces,
   at least one elementary chip arranged on one of the main surfaces and adapted to be electrically linked to the device with a mobile element.

2. The device according to claim 1, further comprising an actuating circuitry of the mobile element included in the cavity.

3. The device according to claim 2, wherein the actuating circuitry is configured to perform electrostatic actuation and comprises a first electrode overlapping a second electrode, one of the electrodes being arranged on the mobile element.

4. The device according to claim 1, wherein the at least one elementary chip is formed in the support substrate, the support substrate being made from semi-conductor material.

5. The device according to claim 1, wherein the at least one elementary chip comprises an electric connection passing through the support substrate, the electric connection being electrically linked to the device with a mobile element.

* * * * *